United States Patent
Johansson et al.

(12) 
(10) Patent No.: US 6,313,001 B1
(45) Date of Patent: Nov. 6, 2001

(54) METHOD FOR SEMICONDUCTOR MANUFACTURING

(75) Inventors: Ted Johansson, Djursholm; Jan-Christian Nyström, Sollentuna, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/433,795

(22) Filed: Nov. 3, 1999

(30) Foreign Application Priority Data

Nov. 4, 1998 (SE) .................................................. 9803767

(51) Int. Cl.⁷ ............................................. H01L 21/8222
(52) U.S. Cl. .......................... 438/340; 438/350; 438/205
(58) Field of Search ................................. 438/203, 205, 438/322, 323, 340, 350, 309

(56) References Cited

U.S. PATENT DOCUMENTS

| | | | |
|---|---|---|---|
| 3,969,748 | 7/1976 | Horie et al. ............................. | 357/46 |
| 4,025,364 | 5/1977 | Smith ..................................... | 148/1.5 |
| 4,043,849 | * 8/1977 | Kraft et al. . | |
| 4,133,701 | 1/1979 | Greenstein et al. ................... | 148/1.5 |
| 4,535,531 | 8/1985 | Bhatia et al. .......................... | 29/577 |
| 4,596,605 | 6/1986 | Nishizawa et al. ................... | 148/1.5 |
| 4,882,294 | * 11/1989 | Chistenson . | |
| 5,149,663 | 9/1992 | Chai et al. . | |

FOREIGN PATENT DOCUMENTS 0 143 670   6/1986  (EP) .

\* cited by examiner

*Primary Examiner*—Tuan H. Nguyen
(74) *Attorney, Agent, or Firm*—Burns, Doane, Swecker & Mathis, L.L.P.

(57) ABSTRACT

The present invention relates to a method for semiconductor manufacturing of one semiconductor circuit, having a multiple of transistors NMOS1, NMOS2, NPN1, NPN2 of one type. The method comprises the steps of arranging a first region 4, 16 on a semiconductor substrate 1, and implementing two transistors of said type, having different sets of characteristics, in said first region 4, 16. The step of implementing said active devices comprises a step of creating a first 6', 10' and a second 6", 10" subregion within said first region 4, 16, and said step further comprising a step of introducing dopants having different sets of dose parameters, into a first and a second area, respectively, of said first region, said dopants being of a similar type, and a step of annealing said substrate 1 to create said first 6', 10' and second 6", 10" subregion, respectively, whereby two subregions, having different doping profiles, can be manufactured on a single integrated circuit.

5 Claims, 3 Drawing Sheets

METHOD FOR SEMICONDUCTOR MANUFACTURING

TECHNICAL FIELD OF THE INVENTION

The present invention relates to a method for semiconductor manufacture, and more specifically to manufacture of a multiple of bipolar or MOS transistors of a specific type on a semiconductor substrate, where each semiconductor transistor may have different characteristics.

DESCRIPTION OF RELATED ART

Bipolar integrated circuits play a major role in modern telecommunication systems. The bipolar circuits are mostly used for analogue functions, e.g. for switching currents and voltages, and for high-frequency radio circuit functions (mixers, amplifiers, detectors, etc.).

A common trend in microelectronics is to integrate more and more functions on a single chip, in order to increase the general performance, and to reduce the size, the power consumption and the prize of the system. This integration has some drawbacks, one is that the device characteristics can not be separately optimised for each different sub block that is being integrated. Instead the characteristics must be selected to some compromise that fits the different devices requirements equally well. This is especially true if one of the parameters to obtain maximum performance before integration was the use of different supply voltages.

The electrical performance of a bipolar transistor is mainly set by its vertical emitter/base/collector profile, where the characteristics of the base is usually the dominating part. The base is commonly formed by ion implantation. An activation anneal/drive-in heat cycle then finalises the emitter/base/collector profile.

By varying the parameters for these two steps, the characteristics of the transistor can be tuned in a large range. For a device which will be operated at very high frequencies, a shallow and abrupt base (obtained by using low implantation energy and short heat cycle) is necessary, while for low-noise transistors or switching transistors, wider bases with lower base resistance and/or better current handling capacity are preferred.

When manufacturing semiconductor devices on a semiconductor substrate, each type of active device, e.g. NMOS transistor or NPN bipolar transistor, is usually made with one predetermined set of characteristics, due to difficulties in controlling different characteristics within each type of active device. Variations in characteristics are preferably made by altering the geometric pattern of the active devices.

The common way of making semiconductor devices comprises the following steps: masking, introducing dopants in unmasked areas and annealing. The introduction of dopants is normally made by ion implantation and determines a part of the characteristics of each device.

A semiconductor circuit may include active devices, e.g. transistors, and passive devices, e.g. resistors and capacitors. More complex circuits include transistors of different types, e.g. BiCMOS processes. Such a process is described in U.S. Pat. No. 5,149,663 by Chai et al, where different types of transistors are manufactured simultaneously.

Introduction of dopants may also be performed sequentially in the same unmasked area before annealing, as described in U.S. Pat. No. 4,596,605.

In U.S. Pat. No. 4,133,701, by Greenstein et al., a method is described for making bipolar transistors having different characteristics. Selected halogen ion implanted is used to locally specifically enhance phosphorus diffusion, which is used to form the emitter region. The halogen implantation is performed prior to boron diffusion, which is used to form the base region. The halogen implantation causes the emitter region to be deeper, but does not affect the base region.

In EP 0 143 670, by Fujitsu Limited, a method is described for making different types of bipolar transistors having different characteristics on the same substrate. This is achieved by simultaneous making the base region for selected transistors and the emitter region for all transistors. The purpose with the invention is to manufacture a bipolar transistor having high switching speed and at the same time manufacture a bipolar transistor having a high withstand voltage.

The above mentioned prior art does not anticipate the need for having transistors of the same type with different sets of characteristics implemented on the same chip.

SUMMARY

A first problem not solved by the prior art is how to manufacture at least two bipolar transistors of the same type, each transistor having essentially the same emitter region, but different characteristics.

A second problem not solved by the prior art is how to manufacture at least two MOS transistors of the same type, each transistor having essentially the same source and drain region, but different characteristics.

The first problem is solved by a method for semiconductor manufacturing of at least one semiconductor circuit, which circuit comprises a multiple of bipolar transistors of a specific type being implemented on a semiconductor substrate. The method comprises the steps of: arranging a first region on said semiconductor substrate having a first dopant of a first type, forming at least a first and a second base region in said first region, forming an emitter region by introducing a second dopant of said first type into each of said base regions, and forming a collector region by introducing a third dopant of said first type into said first region. The step of forming said base regions comprises the steps of: introducing at least a fourth and a fifth dopant of a second type, opposing said first type, said fourth and fifth dopant having different sets of dose parameters, into at least a first and a second area of said first region, respectively, and annealing said substrate to create said at least first and second base region, respectively, prior to said steps of forming said emitter, whereby at least two base regions are created with different doping profiles during a single step of annealing, and at least two bipolar transistors are created with different characteristics in said semiconductor circuit.

The second problem is solved with a similar method for semiconductor manufacturing of at least one semiconductor circuit, which circuit comprises a multiple of MOS transistors of a specific type being implemented on a semiconductor substrate. The method comprises the steps of: arranging a first region on said semiconductor substrate, forming at least a first and a second channel region in said first region, and forming a source region and a drain region by introducing a first dopant of a first type on two opposite sides of each channel region. The step of forming said channel regions comprises the steps of: introducing at least a second and a third dopant of a second type, opposite said first type, said second and third dopant having different sets of dose parameters, into at least a first and a second area of said first region, respectively, and annealing said substrate to create said at least first and second channel region, respectively, prior to said step of forming said source region and drain region, whereby at least two channel regions are created with different doping profiles during a single step of annealing, and at least two MOS transistors are created with different threshold voltage in said semiconductor circuit.

More detailed embodiments of the present invention is set forth in the independent claims.

An advantage with the present invention is the possibility to combine transistors of the same type, such as a NPN bipolar transistor, with different sets of characteristics on the same semiconductor circuit, and thereby optimise the performance and function of the chip.

Another advantage is that the characteristics of the different devices can be varied within a large range.

DETAILED DESCRIPTION OF EMBODIMENTS

Figure 1:
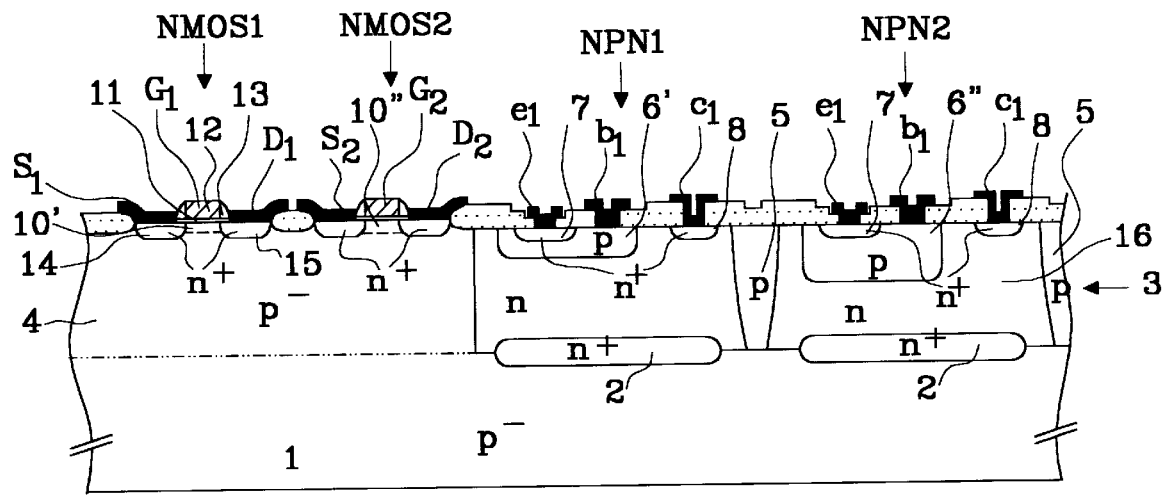
FIG. 1 shows a cross-section of a BiCMOS circuit, including two types of transistors manufactured according to the invention.

FIG. 1 shows a cross-section of a BiCMOS circuit, including two types of transistors manufactured according to the invention. The BiCMOS circuit is manufactured on a substrate 1 being doped with a dopant of a first type, in this example p. Buried layers 2 are arranged between the substrate and an epitaxial layer 3. Each buried layer 2 is doped with a dopant of a second type, in this example n, and forms a part of a collector in a bipolar transistor NPN1 and NPN2, which is a first type of transistor.

The epitaxial layer 3 is initially doped with a dopant of the first type p, and a second type of transistor, NMOS transistor NMOS1 and NMOS2, is implemented in this region, the so called MOS-region 4. The region above the buried layers 2 is doped with a dopant of the second type n, to form a bipolar region 16 (BIP-region), where the bipolar transistors are implemented.

The MOS-region 4 is in this case the epitaxial layer 3, but may be any suitable doped well, p or n type. The epitaxial layer 3 is, for clarity reasons, regarded to be a well of said first type p.

Each bipolar transistor needs to be fully isolated from neighbouring devices. This is achieved by implementing isolation regions 5, extending from the substrate 1 up to the surface of the epitaxial layer 3. Each bipolar transistor have a base region 6', 6", being doped with a dopant of the first type p, and within that base region an emitter region 7, being doped with a dopant of the second type n. A collector region 8, being doped with a dopant of the second type n, is implemented beside the base region 6', 6". Each bipolar transistor NPN1, NPN2 then have an emitter contact $e_1$, $e_2$, a base contact $b_1$, $b_2$ and a collector contact $c_1$, $c_2$.

Each NMOS transistors have a channel region 10', 10", being doped with a dopant of the same type as the MOS-region (p). A gate oxide 11 a polysilicon gate 12 and spacers 13 are then created on top of each channel region 10', 10". A source region 14 and a drain region 15 are implemented, in the MOS-region 4, on each side of the gate 12.

The inventive method for manufacturing transistors is applicable for various types of active devices, such as bipolar transistors and MOS-transistors, as is described below. Other types of active devices may also be manufactured by the inventive method. The common methods for manufacturing semiconductor devices are not described in details, since they are obvious to a person skilled in the art, and the inventive method is described as a complement to those methods.

FIGS. 2a–2d show partial cross-sections of a semiconductor circuit during different manufacturing steps for the two NPN bipolar transistors, from FIG. 1, having different characteristics according to the invention.

Figure 2A:
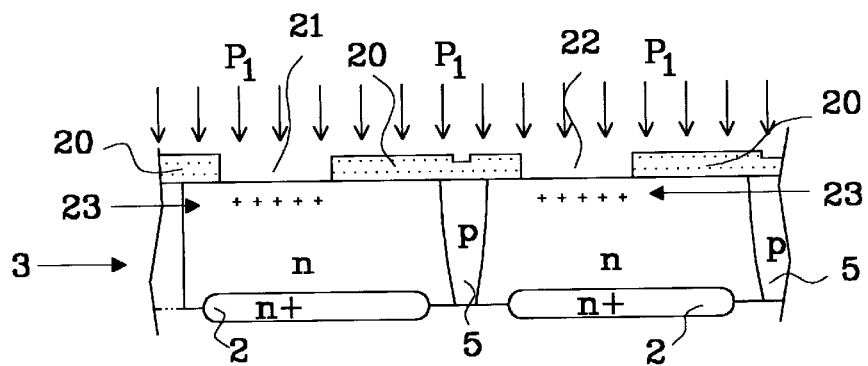
FIGS. 2a–2c show cross-sections of different manufacturing steps for two NPN bipolar transistors having different characteristics according to the invention.

FIG. 2a shows a cross-section of a substrate (partially shown) having buried layers 2 and epitaxial layer 3, where said epitaxial layer have been doped with a dopant of the second type n to form a BIP-region 16. Isolation regions 5 have been implemented to isolate the bipolar transistors from each other. During these process steps, a layer of field oxide 20 have been created on top of the BIP-region 16. A first dopant $P_1$ of a first type p, e.g. Boron, is ion implanted through a first and second opening 21, 22 in the oxide layer 20. Said first dopant having a first set of dose parameters, e.g. energy and implantation time, which results in a number of impurities 23, at a first depth, in the BIP-region 16. These impurities are marked as plus signs in the drawing to indicate that the present impurity creates a shortage of electrons (group III elements).

Figure 2B:
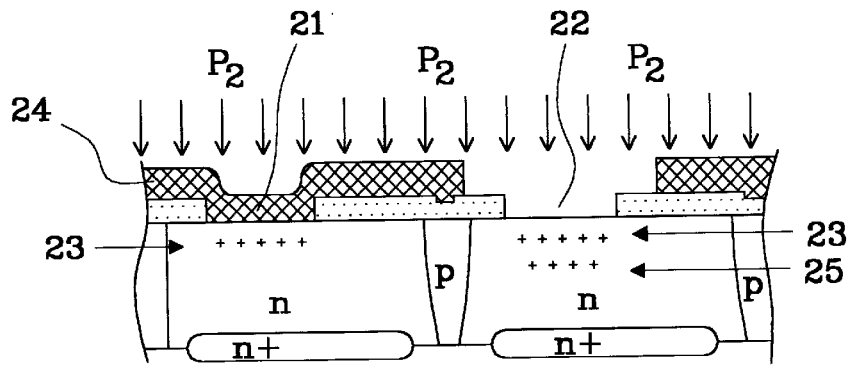

FIG. 2b shows a cross-section of same devices as FIG. 2a with the addition of a protective layer 24, e.g. photo resist, covering said first opening 21. A second dopant $P_2$, of the same type as the first dopant, is thus only implanted through said second opening 22. Said second dopant $P_2$ having a second set of dose parameters, which result in another number of impurities 25, at a second depth, in the BIP-region 16. Thus creating a combination of said first and second set of parameters.

The relationship between said first and second depth may be arbitrary, and even identical. The important difference between said the ion implantation through said first and second opening is that at least one parameter of said first set of dose parameters and the combination of said first and second set of parameters is different, e.g. if the same impurity is used, a difference in ion implantation energy results in additional impurities at an additional depth and a difference in ion implantation time, using the same impurity, results in different number of impurities at the same depth.

Figure 2C:
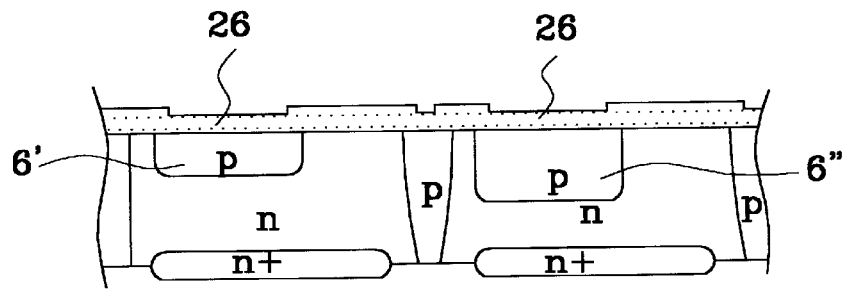

The protective layer is removed and the device is subject to an annealing step for a predetermined time to distribute the impurities and form base regions 6', 6". The base regions having different doping profiles due to the previous implantation steps. During the annealing step, a base oxide 26 is grown on top of each base region. This is illustrated in FIG. 2c.

Figure 2D:
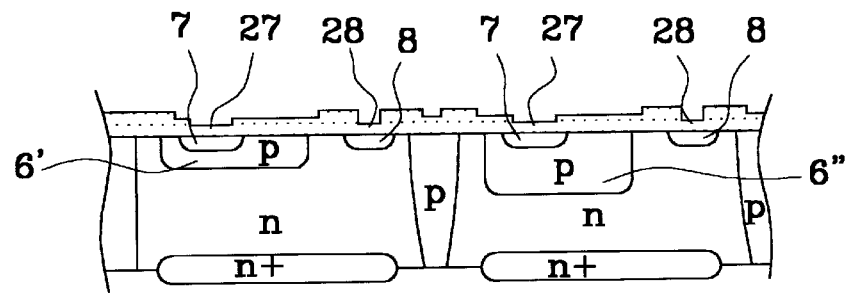

An emitter region 7 is formed in the base region 6', 6" and a collector region 8 is formed on the side of said base region. At the same time an emitter oxide 27 and a collector oxide 28 is grown on top of each region, respectively. An illustration of this is shown in FIG. 2d.

The emitter region, base region and collector region are then contacted to establish an emitter contact $e_1$, $e_2$, a base contact $b_1$, $b_2$ and a collector contact $c_1$, $c_2$, as is shown in FIG. 1. This makes it possible to interconnect the semiconductor devices on a semiconductor circuit or directly access the transistors.

This technique for manufacturing bipolar transistor with different doping profiles in the base region, may of course be used for manufacturing bipolar transistor with different collector or emitter regions. Different doping profiles in the collector region provides devices that could work with different supply voltages or different frequency characteristics, according to "Johnson Limit", on the same integrated circuit, and different doping profiles in the emitter regions causes more or less the same effect as variation of the doping profiles in the base regions.

FIGS. 3a–3e show cross-sections of a semiconductor circuit during different manufacturing steps for two NMOS transistors having different characteristics according to the invention.

Figure 3A:
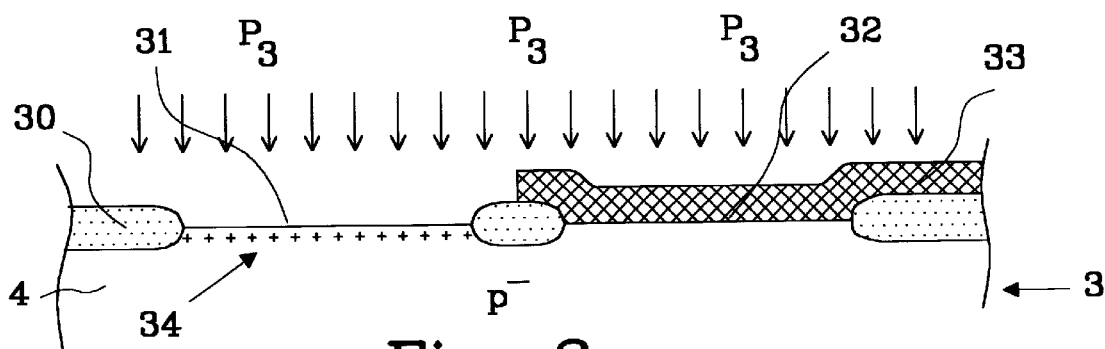
FIGS. 3a–3e show cross-sections of different manufacturing steps for two NMOS transistors having different characteristics according to the invention.

FIG. 3a shows a cross-section of an epitaxial layer 3 being grown on top of the substrate (not shown). The epitaxial layer forms a MOS-region 4, which is doped with a dopant of the first type p, as described above. During previous process steps, a field oxide 30 has been created on top of the MOS-region 4. A first 31 and a second 32 opening are arranged in the field oxide 30, and instead of implanting both exposed areas of the MOS-region 4, a first protective coating 33 is placed over one of the openings, in this example the second opening 32. A first dopant $P_3$ of the second type p is introduced through said first opening 31 by means of ion implantation, which results in a number of impurities 34 in said exposed MOS-region.

It is of course possible to implant the first impurity through both openings as in the previous example, but this example illustrates the possibility to make arbitrary combinations.

Figure 3B:
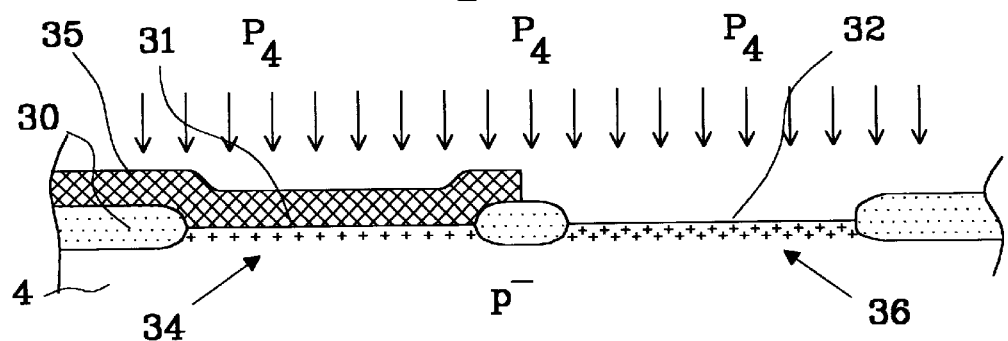

The first protective coating 33 is then removed and a second protective coating 35 is placed over said first opening 31, exposing said MOS-region 4 through second opening 32, as shown in FIG. 3b. A second dopant $P_4$ of the second type p is introduced through said second opening 32 by means of ion implantation, which results in another number of impurities 36 in said exposed MOS-region.

The protective coating is removed and a gate oxide 11 is then deposited on top of said exposed MOS-regions. The device is subject to an annealing step during manufacture of said gate oxide 11 and the impurities are distributed to form doped regions 37', 37". The result of these steps is shown in FIG. 3c.

Figure 3C:
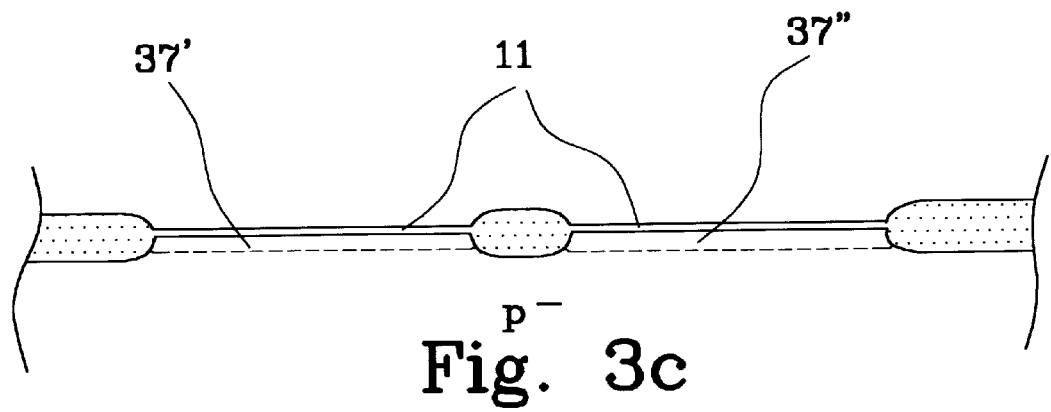
Figure 3D:
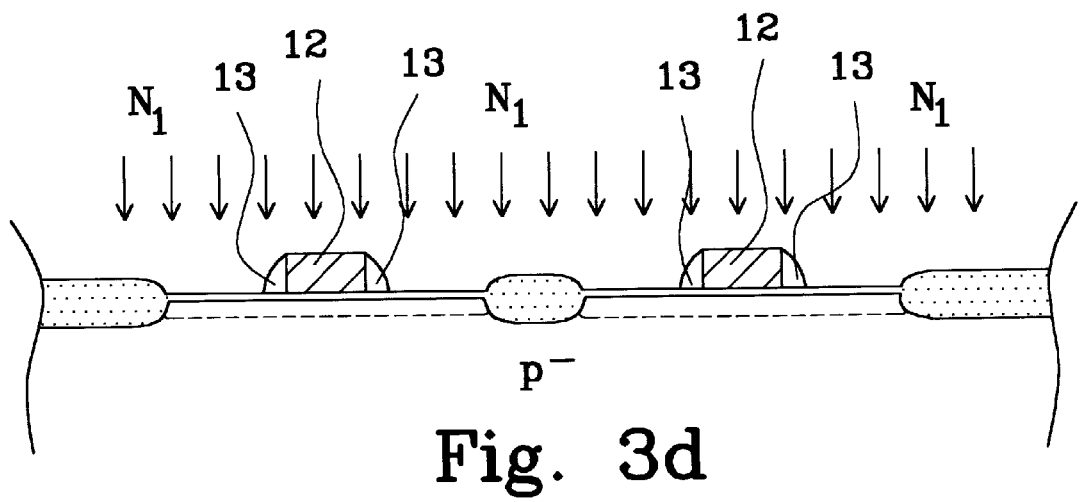
Figure 3E:
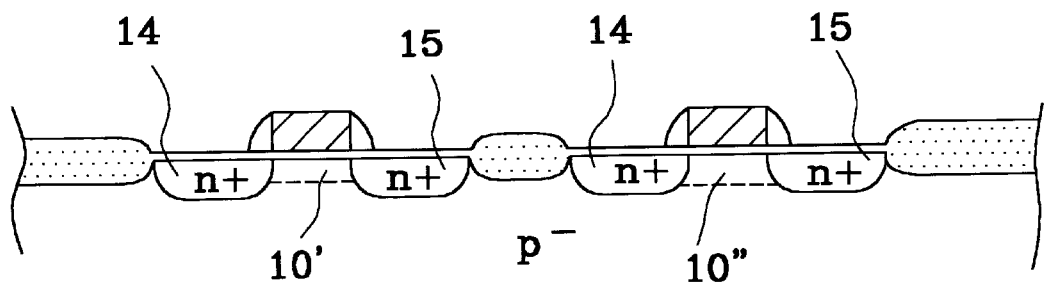

FIG. 3d shows a cross-section of the device from FIG. 3c, where a polysilicon gate 12 have been created with spacers 13. These manufacturing steps are familiar to a person skilled in the art, and so is the manufacturing steps describing the manufacture of source 14 and drain 15 regions and doping of the polysilicon gate 12 by utilising ion implantation with a dopant $N_1$, of the second type n, such as Arsenic, as is described in FIG. 3e. The establishment of source and drain region distributes the impurities further in the doped regions 37', 37" and also reduces the doped regions into channel regions 10', 10", where said channel regions have different doping profiles and different threshold voltage.

These examples only show two transistors of each type, but it is to be understood that an arbitrary number of transistor within each type may be implemented using the inventive method. Furthermore, the method is not limited to just two types of transitors, but may be used for any number of transistor types.

The shown examples only show bipolar NPN and NMOS transistors, but the method may readily be used when manufacturing bipolar PNP and PMOS transistors, or any other type of transistor, such as double poly bipolar transistors for high frequencies.

The protective coating is preferable made of a photo resist, due to the non-destructible removal process, but other coatings may be used, such as oxide, nitride and polyimide.

What is claimed is:

1. A method for semiconductor manufacturing of at least one semiconductor circuit, which circuit comprises a multiple of bipolar transistors of a specific type being implemented on a semiconductor substrate, said method comprising the steps of:

arranging a first region on said semiconductor substrate having a first dopant of a first type, forming at least a first and a second base region in said first region comprising the steps:
introducing at least a second and a third dopant of a second type, opposing said first type, said second and third dopant having different sets of dose parameters, into at least a first and a second area of said first region, respectively, and
annealing said substrate to create said at least first and second base region, respectively, prior to the step of forming an emitter region, forming an emitter region by introducing a fourth dopant of said first type into each of said base regions, and forming a collector region by introducing a fifth dopant of said first type into said first region, whereby at least two base regions are created with different doping profiles during a single step of annealing, and at least two bipolar transistors are created with different characteristics in said semiconductor circuit.

2. The method for semiconductor manufacturing according to claim 1, wherein each step of introducing said second and third dopant comprises:

selecting at least one area for introducing at least one of said second and third dopant, and ion implantation of said at least one dopant into said at least one area in said region.

3. The method for semiconductor manufacturing according to claim 2, wherein said step of introducing said second and third dopant further comprises the steps of:

coating the region with a protective layer prior to said ion implantation step, and removing said protective layer from the region after said ion implantation step.

4. The method for semiconductor manufacturing according to claim 1, wherein each set of dose parameters is selected by varying dose parameter and/or energy parameter.

5. The method for semiconductor manufacturing according to claim 1, wherein each emitter region of said at least two bipolar transistors is selected to be essentially equal.

* * * * *